United States Patent
Hecht et al.

(10) Patent No.: US 7,176,514 B2
(45) Date of Patent: Feb. 13, 2007

(54) METHOD AND CONFIGURATION FOR REINFORCEMENT OF A DIELECTRIC LAYER AT DEFECTS BY SELF-ALIGNING AND SELF-LIMITING ELECTROCHEMICAL CONVERSION OF A SUBSTRATE MATERIAL

(75) Inventors: Thomas Hecht, Dresden (DE); Albert Birner, Dresden (DE); Harald Seidl, Feldkirchen (DE); Uwe Schröder, Dresden (DE); Stefan Jakschik, Dresden (DE); Martin Gutsche, Dorfen (DE)

(73) Assignee: Infineon Technologies AG, Munich (DE)

( * ) Notice: Subject to any disclaimer, the term of this patent is extended or adjusted under 35 U.S.C. 154(b) by 136 days.

(21) Appl. No.: 10/413,812

(22) Filed: Apr. 15, 2003

(65) Prior Publication Data

US 2003/0224584 A1    Dec. 4, 2003

(30) Foreign Application Priority Data

Apr. 15, 2002 (DE) .............................. 102 16 614

(51) Int. Cl.
*H01L 27/108* (2006.01)
*H01L 21/76* (2006.01)

(52) U.S. Cl. .................... 257/310; 438/441; 438/386; 257/E27.048

(58) Field of Classification Search ............... 438/408, 438/386, 441; 257/302, 310
See application file for complete search history.

(56) References Cited

U.S. PATENT DOCUMENTS

| | | | |
|---|---|---|---|
| 1,344,752 A | 6/1920 | Chubb | |
| 4,122,509 A * | 10/1978 | Frade et al. | 361/524 |
| 5,084,400 A * | 1/1992 | Nath et al. | 438/88 |
| 5,208,189 A | 5/1993 | Nguyen et al. | |
| 5,236,573 A | 8/1993 | Shannon | |
| 5,759,903 A * | 6/1998 | Lehmann et al. | 438/386 |
| 5,782,665 A * | 7/1998 | Weisfield et al. | 445/24 |
| 5,877,977 A | 3/1999 | Essaian | |
| 6,067,244 A | 5/2000 | Ma et al. | |
| 6,143,627 A | 11/2000 | Robinson | |
| 6,151,241 A | 11/2000 | Hayashi et al. | |
| 6,175,131 B1 * | 1/2001 | Adan | 257/306 |
| 6,198,124 B1 | 3/2001 | Sandhu et al. | |
| 6,340,613 B1 | 1/2002 | DeBoer | |
| 6,559,069 B2 * | 5/2003 | Goldbach et al. | 438/770 |
| 6,730,575 B2 * | 5/2004 | Eldridge | 438/396 |

(Continued)

FOREIGN PATENT DOCUMENTS

DE    22 18 186    11/1972

(Continued)

Primary Examiner—W. David Coleman
(74) Attorney, Agent, or Firm—Laurence A. Greenberg; Werner H. Stemer; Ralph E. Locher (57) ABSTRACT

A method for producing a dielectric layer on a substrate made of a conductive substrate material includes reducing a leakage current that flows through defects of the dielectric layer at least by a self-aligning and self-limiting electrochemical conversion of the conductive substrate material into a nonconductive substrate follow-up material in sections of the substrate that are adjacent to the defects. Also provided is a configuration including a dielectric layer with defects, a substrate made of a conductive substrate material, and reinforcement regions made of the nonconductive substrate follow-up material in sections adjacent to the defects.

25 Claims, 3 Drawing Sheets

U.S. PATENT DOCUMENTS

2002/0137362 A1* 9/2002 Jammy et al. ............... 438/791
2004/0197965 A1* 10/2004 Birner et al. ............... 438/149

FOREIGN PATENT DOCUMENTS

| EP | 0 996 147 A1 | 4/2000 |
| EP | 1 078 998 A2 | 2/2001 |
| GB | 1 281 792 | 7/1972 |
| JP | 11 150 041 A | 6/1999 |

* cited by examiner

Electro Chemical Oxidation

METHOD AND CONFIGURATION FOR REINFORCEMENT OF A DIELECTRIC LAYER AT DEFECTS BY SELF-ALIGNING AND SELF-LIMITING ELECTROCHEMICAL CONVERSION OF A SUBSTRATE MATERIAL

BACKGROUND OF THE INVENTION

Field of the Invention

The invention relates to a method for producing a thin dielectric layer on a substrate made of a conductive substrate material that can be oxidized to form a nonconductive substrate follow-up material. The method provides the substrate and applies the dielectric layer, the dielectric layer having electrically conductive defects.

In semiconductor process technology, dielectric materials (also called dielectrics hereinafter) are used for the isolation of circuit sections, as a dielectric layer between electrodes of capacitors, and also as an insulator layer between a gate electrode and a controllable semiconductor path of field-effect transistors. For the isolation of circuit sections or interconnects, dielectrics having a low permittivity are preferred in such a case to reduce the capacitive coupling of signals between circuit sections and/or the capacitance of an electrically conductive connection. For the use in field-effect transistors and capacitors, dielectrics having a high permittivity are preferred to realize larger capacitances given otherwise identical dimensions of a capacitor.

Particularly in the fabrication of dynamic random access memories (DRAMs) having several million memory cells each with a transistor and a capacitor, memory cells having smaller dimensions are demanded as memory sizes increase. Because the space requirement of a memory cell, in turn, is predominantly determined by the space requirement of the capacitor, the space requirement of the capacitor is proportional to the capacitance of the capacitor, and, for reliable operation of the memory cell, the capacitance of the capacitor must not fall below a minimum value, the need arises to provide a dielectric layer—situated between the two electrodes of the capacitor—which has the smallest possible layer thickness and is made of a material having the highest possible permittivity.

The size of the capacitor of a memory cell is, thus, reduced further, the capacitance of the capacitor remaining large enough to store a sufficiently large charge during operation of the memory cell. To reduce the space requirement of a memory cell on the surface of a semiconductor substrate, the capacitors are configured in a known manner, for example, in trenches of the semiconductor substrate or on the surface of the semiconductor substrate (stacked capacitor). In parallel with the development of new layout designs for memory cells, solutions for reducing the physical size of the capacitor in conjunction with sufficient capacitance remaining are, furthermore, being sought. In such a case, the capacitance of a capacitor is determined by the areas of its electrodes, the distance between the electrodes and the permittivity of the material of a dielectric layer situated between the two electrodes.

The dielectric layer is, usually, fashioned as a oxide or nitride layer or as a multilayer layer including oxide and nitride layers. Nitride and oxide layers have a sufficiently high permittivity and can be deposited as very thin layers (less than 10 nm) by the customary methods in semiconductor process technology. Defects arise in the nitride layer either directly during the deposition itself or on account of thermomechanical stresses in subsequent process steps. If, in an operating state of the memory cell, a potential is, then, applied between the two electrodes of the memory cell, charge carriers, generally electrons or holes, are transported along structural defects in the dielectric layer. An undesirable leakage current flows between the two electrodes. In such a case, the storage capacitor is at least partially discharged and the data content of the memory cell becomes at least more difficult to detect. At weak points of the dielectric layer, the dielectric layer may be subjected to breakdown on account of an excessive field increase, whereupon, a further proportion of the leakage current flows between the two electrodes of the capacitor through defects so produced. To suppress the formation of such defects, dielectric layers, after their deposition, are subjected to a thermal aging, in the course of which, defects develop from potential weak points, which defects are annealed in a subsequent oxidation step. In such a case, defects (pinholes) in a silicon nitride layer are filled by incorporation of oxygen into the silicon nitride layer and the associated densification and/or reinforcement of the silicon nitride layer. In the underlying thermal aging step, the substrate is heated with the dielectric layer for about 20 to 90 minutes in an oxygen atmosphere to a temperature of 700 to 850 degrees Celsius.

U.S. Pat. No. 6,340,613 to De Boer describes, for instance, a method for aftertreating a dielectric layer made of silicon nitride with a layer thickness of less than 5 nm with the aid of two rapid thermal steps (rapid thermal process) in an oxidizing environment. The aftertreatment reduces the number of defects in the dielectric layer.

$Ta_2O_5$, $TiO_2$, $HfO_2$, $ZrO_2$, and $Al_2O_3$, for instance, are known as further dielectric materials. Thus, by way of example, $Ta_2O_5$ has a permittivity that is about three times higher than that of $Si_3N_4$. At the present time, the use of such materials as a dielectric is still restricted by their lack of stability and by diffusion processes. By way of example, the tantalum of a tantalum pentoxide layer tends to outdiffuse from the dielectric layer, the permittivity of the dielectric layer, consequently, decreasing. Moreover, the dopants of the adjoining electrode areas, for instance, diffuse out of the electrode areas into the dielectric. At the present time, such diffusion processes are prevented by additional diffusion barrier layers.

Thus, U.S. Pat. No. 6,198,124 to Sandhu, et al., for instance, describes a method for fabricating a dielectric layer made of $Ta_2O_5$. In such a case, a predominantly amorphous diffusion barrier layer is deposited after the deposition of the dielectric layer.

Thus, in the realization of very thin dielectric layers, or of dielectric layers made of materials having an increased or high permittivity, the dictates of the process initially give rise to limitations. Possible solutions have already been proposed for overcoming the limitations, for instance, intermediate layers that act as diffusion or reaction barriers.

A further effect of very thin dielectric layers or of dielectric layers made of materials having an increased or high permittivity is weak points or defects. In such a case, defects (pinholes) are, for instance, inclusions made of a different material than that of the dielectric layer. The inclusions arise, on one hand, directly during the deposition of the dielectric layer. On the other hand, the dielectric layer may have, after deposition, depressions, cracks, and the like that are filled with a conductive material during a subsequent formation of an overlying electrode made of the material. Weak points in the dielectric are initially noncontinuous holes or bridges in the dielectric layer that turn into defects in the further course of the process or after the application of an electrical potential.

In particular, defects and weak points in the case of dielectric layers that have completely or partially crystallized out are also interfaces at which crystallites of the dielectric layer adjoin one another (also referred to as grain boundaries hereinafter).

The dictates of the process mean that the probability of pinholes rises exponentially as the layer thickness of the dielectric layer decreases. With the use of oxidic dielectrics having a high permittivity, which are deposited in a first process step and are subjected to a crystallization process in a second process step, grain boundaries delimiting the crystallization regions form constrictions of the dielectric layer that, in an operating state of the memory cell, act as preferred paths for a charge carrier transport between the two electrodes (leakage current path). For thin dielectric layers that are subjected to a crystallization process after deposition, leakage current paths have, hitherto, foreseeably been an applicability-restricting property.

A comparatively high leakage current in very thin layers has hitherto been an obstacle, for instance, to the use of $Al_2O_3$, which participates in diffusion processes neither actively nor passively to an appreciable extent.

Finally, known methods for annealing dielectric layers, for instance, the incorporation of oxygen into the dielectric layer, are ruled out in the case of very thin layers due to the high thermal loading, or are not expedient in the case of oxidic dielectrics having a high permittivity due to the low thermal loading capacity thereof. Furthermore, a thermal oxidation leads to a whole-area oxidation of the underlying substrate and, thus, to a disadvantageous reduction of the capacitance of the configuration.

SUMMARY OF THE INVENTION

It is accordingly an object of the invention to provide a method and configuration for reinforcement of a dielectric layer at defects by self-aligning and self-limiting electrochemical conversion of a substrate material that overcomes the hereinafore-mentioned disadvantages of the heretofore-known devices and methods of this general type and that reinforces a dielectric layer at defects simply, mildly and reliably.

With the foregoing and other objects in view, there is provided, in accordance with the invention, a method for producing a thin dielectric layer on a substrate, including the steps of providing a substrate of a conductive substrate material that can be oxidized to form a nonconductive substrate follow-up material, applying the dielectric layer to the substrate, the dielectric layer having electrically conductive defects, introducing the substrate having the dielectric layer into an electrolyte-filled electrochemical cell having first and second electrodes, electrically connecting the first electrode to the substrate and electrically connecting the second electrode with the electrolyte, producing an electrical potential between the first and second electrodes and then controlling a current flow between the electrolyte and the substrate in an electrochemical process, the current flow being established through the dielectric layer in regions of the defects and by an electrochemical reaction, chemically altering the substrate material in regions adjoining the defects and converting the chemically altered substrate material into the substrate follow-up material.

A method for producing a thin dielectric layer on a substrate made of a conductive substrate material that can be oxidized to form a nonconductive substrate follow-up material, includes at least the process steps of:

(a) providing the substrate;

(b) applying the dielectric layer, the dielectric layer having electrically conductive defects;

and, following:

(c) introducing the substrate into an electrolyte-filled electrochemical cell with two electrodes;

(d) connecting the first electrode to the substrate and bringing the second electrode into contact with the electrolyte; and (e) producing an electrical potential between the two electrodes and controlling a current flow between electrolyte and substrate in an electrochemical process, the current flow being established through the dielectric layer in the region of the defects, and, by an electrochemical reaction, the substrate material being chemically altered, preferably, in regions adjoining the defects of the dielectric layer and being converted into the substrate follow-up material.

The method according to the invention utilizes the different electrical conductivity of the dielectric layer in defect-free sections, on one hand, and in the region of defects, on the other hand. A charge or ion flow takes place only in the region of defects so that a substrate adjoining the dielectric layer is oxidized exclusively in the region of the defects. The dielectric layer is reinforced selectively in the region of defects by the conversion of the conductive substrate material into a dielectric substrate follow-up material. As result of the oxidation of the substrate, the electrical resistance increases at the defects so that the charge or ion transport finally stops.

The method according to the invention is carried out such that, first, a dielectric layer is applied at least in sections on a conductive substrate made of doped silicon, for example, by vapor phase deposition (chemical vapor deposition (CVD), atomic layer deposition (ALD), or physical vapor deposition (PVD). Afterward, in an electrochemical cell, the substrate is connected to the first electrode (anode) of the electrochemical cell. The second electrode (cathode) of the electrochemical cell is disposed opposite the coated substrate. The cell is filled with an electrolyte. The application of a potential difference between the two electrodes of the electrochemical cell gives rise to an ion transport through the defects of the dielectric layer. The substrate material is oxidized in sections adjoining defects of the dielectric layer. If the substrate material is chosen such that the oxidation product is electrically insulating, then the dielectric layer is reinforced in these sections into the underlying substrate. This method is self-aligning because an oxide is formed in the substrate layer only in the region of defects.

The method is also self-limiting in the favorable case because the total current through the dielectric layer decreases with increasing oxidation of the substrate material at the preferred leakage current paths. The method can, thus, be terminated as soon as a current intensity between the two electrodes of the electrochemical cell falls below a minimum value corresponding to a maximum permissible total leakage current of the dielectric layer.

This method is largely independent of the material of the dielectric layer provided that an electrolyte is chosen with respect to which the dielectric material has a sufficient etching resistance. The method is, furthermore, suitable for reinforcing dielectric layers of arbitrary layer thickness.

The method according to the invention leads to a significantly reduced leakage current density particularly if the dielectric layer is deposited as initially an amorphous layer, for instance, by vapor phase deposition (ALD, CVD, PVD), and is subjected to a crystallization process in a second step, for instance, by heating. During a crystallization operation, proceeding from various crystallization nuclei, crystallites grow in the dielectric layer. In the crystallized-out dielectric layer, mutually adjoining surfaces of adjacent crystallites form grain boundaries. Grain boundaries, preferably, form weak points or defects in the case of very thin layers. Dielectric layers so produced, thus, tend toward a high leakage current density so that the method according to the invention contributes to a significant improvement of the insulation properties of a dielectric layer.

In accordance with another mode of the invention, there is provided the step of thermally treating the dielectric layer after application and thereby augmenting a plurality of weak points and defects in the dielectric layer with regard to charge carrier transmission.

Particularly preferably, the dielectric layer is thermally pretreated before an electrochemical aftertreatment. In such a case, a thermal budget defined by a time duration of the thermal treatment and a treatment temperature is chosen such that it at least reaches, but more expediently exceeds, a subsequent process technologically required thermal budget. Weak points of the dielectric layer are, thus, expanded to a high degree to form defects and the leakage current density of the dielectric layer is, thus, significantly increased. If a dielectric layer that has been thermally pretreated in this way is, then, reinforced in accordance with the method according to the invention, then defects that would otherwise form only in subsequent process technological steps are, thereby, also to a high degree produced and reinforced virtually in anticipation.

Any conductive material that is converted into an electrically insulating substrate follow-up material by an electrochemical reaction is suitable for the substrate material provided. Silicon, either with an amorphous or crystalline structure, doped or undoped, is, preferably, provided for such a purpose. Silicon is converted into electrically nonconductive silicon dioxide $SiO_2$ by electrochemical oxidation. Although the permittivity of the silicon dioxide is relatively low, the multiplicity of capacitances formed at the defects with an $SiO_2$ dielectric act as a parallel capacitance with respect to the actual capacitance formed with the dielectric material. With the capacitances connected in parallel, the total capacitance is produced from the sum of the partial capacitances so that the low permittivity of the silicon oxide formed does not significantly affect the total capacitance. A precondition for this is that the electrochemical process is controlled such that the extent of the nonconductive regions made of the substrate follow-up material that form in the substrate remains limited to the order of magnitude of the layer thickness of the dielectric layer. In particular, this prevents the regions made of the substrate follow-up material from expanding along a boundary layer (interface) between the substrate, on one hand, and the dielectric layer, on the other hand, and, thus, forming in sections an intermediate layer between the substrate and the dielectric layer that reduces the actual capacitance of the structure in accordance with its total extent and thickness.

In such a case, in all considerations, the dielectric layer may be an individual dielectric layer made of a single dielectric material or a dielectric layer made of a plurality of dielectric materials that is formed from a plurality of partial layers.

Possible materials in such a case are silicon nitride $Si_3N_4$ and silicon dioxide $SiO_2$ because the process technology required for processing such layers yields particularly reliable and reproducible results. Further suitable dielectric materials are those having an increased permittivity, such as $Al_2O_3$, and those having a high permittivity, such as $TiO_2$, $Ta_2O_5$, $Nb_2O_3$, $Y_2O_3$, $ZrO_2$, $HfO_2$, $(Ta_2O_5)_9(TiO_2)_1$, $(Hf,Zr)O_2$, $BaTiO_3$, and $(Ba,Sr)TiO_3$. Combinations of the above-mentioned dielectric materials within each of the partial layers are also possible in this case. An aftertreatment for reducing the leakage current density is necessary particularly in the case of materials that are subjected to a crystallization process after deposition.

In accordance with a further mode of the invention, aqueous $H_2SO_4$ and aqueous HCl, in particular, are suitable as electrolytes. These electrolytes do not attack the above-mentioned dielectric materials and at the same time ensure a sufficiently great ion transport. Typical concentration values lie, for instance, between $10^{-4}$ up to about 1 mol.

In accordance with an added mode of the invention, the electrochemical process in the electrochemical cell is controlled galvanostatically. In such a case, the electrode current is kept largely constant during the electrochemical process and the potential difference between the electrodes is increased as the process duration increases. The oxidation, thus, takes place at a virtually identical rate during the process. As such, quantitatively, a particularly large amount of substrate material is converted into the insulating substrate follow-up material. Particularly large oxidized sections form in the substrate around the defects of the dielectric layer. As a result, defects are reinforced in a particularly lasting fashion. The applicability of the method is limited by the breakdown strength of the dielectric layer or the structures already fashioned in the substrate.

In accordance with an additional mode of the invention, the electrochemical process in the electrochemical cell is controlled potentiostatically. In such a case, the potential difference between the two electrodes of the electrochemical cell is kept largely constant during the electrochemical process. The oxidation process in the substrate material slows down as the process duration increases. As such, the expansion of the sections of the substrate follow-up material can be limited. As a result, it is possible to control a reduction of the capacitance that accompanies the reinforcement process.

By changing between potentiostatic and galvanostatic control of the electrochemical process, the fashioning of the regions made of the substrate follow-up material can be adapted to the requirements.

In accordance with yet another feature of the invention, the dielectric layer is provided at least in sections on an inside of trenches in the substrate.

With the method according to the invention, it is possible, in principle, to improve the leakage current behavior of any dielectric layer, provided that it is disposed on a substrate made of a substrate material that can be converted electrochemically into an electrically nonconductive substrate follow-up material. Preferably, the method according to the invention is provided in the formation of a dielectric layer between two electrodes of a capacitor. In capacitors, in particular, the leakage current density is a function-determining property. Furthermore, to increase the capacitance of the capacitors, dielectric layers of capacitors are configured, in particular, as very thin layers so that high leakage current densities are to be expected from a fabrication technological standpoint. When forming capacitors on semiconductor substrates, the functionality of capacitors can, thus, be improved to a particularly high degree by the method according to the invention.

In accordance with yet a further feature of the invention, the substrate has at least one MISFET having a gate electrode and a channel path and the dielectric layer is disposed between the gate electrode and the channel path.

The use of dielectrics having a high permittivity is also forced as insulator layer of metal insulator semiconductor field effect transistor (MISFET) structures or as oxide layer of metal oxide semiconductor field effect transistor (MOSFET) structures. In the case of such structures, the method according to the invention increases the number of possible materials for the insulator layer.

The method according to the invention is suitable for application on planar as well as on patterned substrate surfaces. Preferably, the advantages of the method according to the invention are attained in the case of application to dielectric layers disposed on a greatly patterned substrate. On one hand, greatly patterned substrates have a significantly larger surface area so that the probability of defects increases, and, on the other hand, the more complicated surface structure leads to a higher number of defects.

A dielectric layer with a very low leakage current density is, thus, produced by the method according to the invention. Therefore, the invention also relates to a configuration including a substrate, which has a conductive substrate material that can be oxidized to form a nonconductive substrate follow-up material, and an adjoining dielectric layer made of a dielectric material, the dielectric layer having electrically conductive defects, and in which, in regions of the substrate that adjoin the defects of the dielectric layer, the substrate material is converted into the substrate follow-up material and forms reinforcement regions.

With the objects of the invention in view, there is also provided a substrate configuration, including a substrate substantially of a conductive substrate material that can be oxidized to form a nonconductive substrate follow-up material, a dielectric layer of a dielectric material, the dielectric layer adjoining the substrate and having electrically conductive defects, and the substrate having reinforcement regions of the substrate follow-up material in sections of the substrate adjoining the defects of the dielectric layer.

In such a case, silicon, in particular, is suitable as the substrate material. Both in its amorphous form and in its crystalline form, either doped or undoped, silicon, by electrochemical oxidation, forms the substrate follow-up material silicon dioxide, which is a very good electrical insulator.

In such a case, the dielectric layer may include a single dielectric partial layer made of a dielectric material or a plurality of partial layers made of different dielectric materials. Suitable dielectric materials are, in particular, $Si_3N_4$ and $SiO_2$ due to their known and mature process technology, and also $Al_2O_3$, $Ta_2O_5$, $Nb_2O_3$, $Y_2O_3$, $TiO_2$, $(Ta_2O_5)_9(TiO_2)_1$, $ZrO_2$, $HfO_2$, $(Hf,Zr)O_2$, $BaTiO_3$, and $(Ba,Sr)TiO_3$. Combinations of the abovementioned dielectric materials within each of the partial layers are also possible in this case.

In accordance with yet an added feature of the invention, the reinforcement regions formed by the substrate follow-up material have a fashioning with regard to their microstructure and their extent that has emerged from a galvanostatically controlled electrochemical process. As a result, particularly highly pronounced reinforcement regions made of the substrate follow-up material are adjacent to the defects of the dielectric layer.

In accordance with a concomitant feature of the invention, the reinforcement regions have a fashioning with regard to their microstructure and their extent that is generated by a potentiostatically controlled electrochemical process. Reinforcement regions so produced influence the capacitive properties of the configuration to a particularly small extent.

Particularly preferably, the dielectric layer is provided between two electrodes of a capacitor. In such a case, the first electrode of the capacitor is identical to the substrate. In this case, assuming an only slight extent of the reinforcement regions along the interface formed by the dielectric layer and the substrate, the defects annealed with the substrate follow-up material act as a plurality of individual capacitances connected in parallel with the total capacitance of the configuration. On account of the lower permittivity of the silicon dioxide, sections of the capacitor with reinforced defects have a lower capacitance than sections of identical area without defects, but act as capacitors connected in parallel. The total capacitance results from the sum of the partial capacitances. Because the defects form only fractions of the total capacitor area in each case, the total capacitance is also not appreciably reduced. This is advantageous particularly with respect to solutions in which additional layers are disposed, for instance, between the substrate and the dielectric layer, for the purpose of reducing the leakage current density. The material of the additional layer is generally a material having low permittivity. In terms of circuitry, an additional layer acts as a capacitance connected in series. In such a case, the smaller capacitance, that is to say, the layer having the lower permittivity, determines the total capacitance of the configuration.

Other features that are considered as characteristic for the invention are set forth in the appended claims.

Although the invention is illustrated and described herein as embodied in a reinforcement of a dielectric layer at defects by self-aligning and self-limiting electrochemical conversion of a substrate material, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
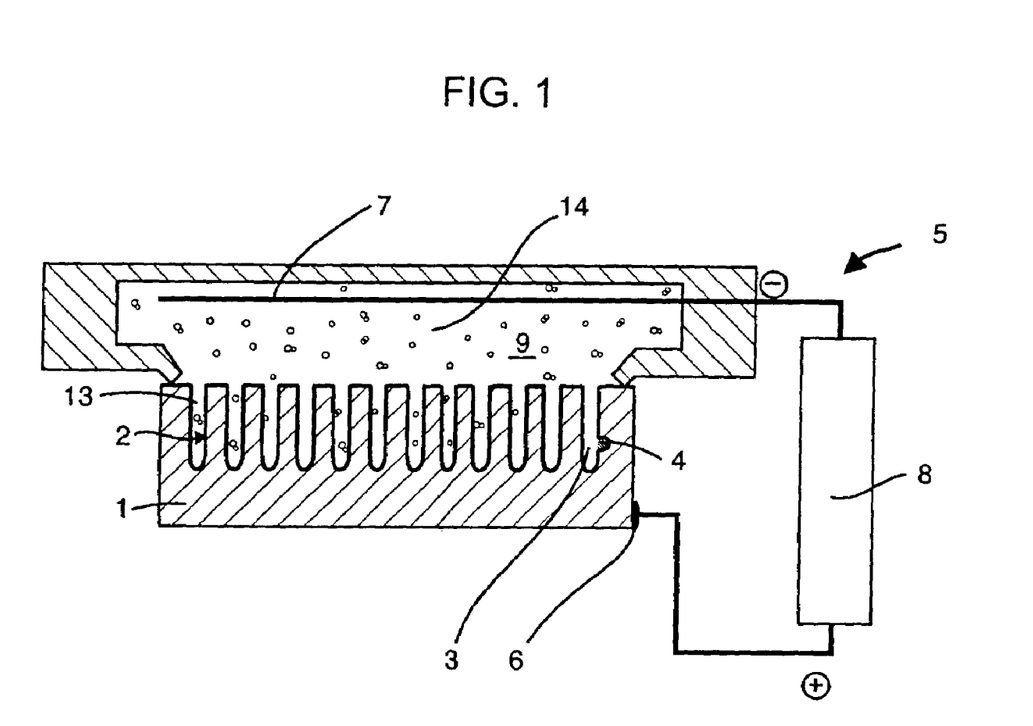
FIG. 1 is a partially cross-sectional view of a diagrammatic illustration of the method according to the invention in an electrochemical cell.

Referring now to the figures of the drawings in detail and first, particularly to FIG. 1 thereof, there is shown a substrate 1 disposed in an electrochemical cell 5. In this case, the substrate 1 is a semiconductor wafer (DT wafer) patterned with deep trenches 13. A thin dielectric layer 2 is disposed on the substrate 1. The dielectric layer 2 has defects (pinholes) 3. The substrate 1 is directly connected to the positive electrode (anode) 6 of the electrochemical cell 5. The negative electrode (cathode) 7 of the electrochemical cell 5 projects freely into a chamber 14 filled with an electrolyte 9. If a potential difference 8 is, then, applied between the two electrodes 6, 7 of the electrochemical cell 5, then an ion transport occurs between the cathode 7 and the substrate 1, as long as the defects 3 of the dielectric layer 2 are transmissive. The substrate 1 is constructed from a substrate material in this case. At locations exposed to the electrolyte 5 through the defects 3 of the dielectric layer 2, the substrate material is converted into a substrate follow-up material. The substrate follow-up material forms electrically insulating reinforcement regions 4. The reinforcement regions 4 form exclusively in regions adjoining defects 3 of the dielectric layer 2. The method is, thus, self-aligning. As a result of the growth of the reinforcement regions 4, the ion flow between the two electrodes 6, 7 gradually decreases given a constant potential difference between the two electrodes 6, 7 and, ideally, stops as soon as all the defects 3 are subsequently electrically insulated by reinforcement regions 4. Possible electrolytes are, for instance, aqueous $H_2SO_4$ with 0.01 mol, for example, or aqueous HCl with 0.01 mol, for example. The potential difference between the two electrodes lies in the range of from 0 to 100 volts.

Figure 2A:
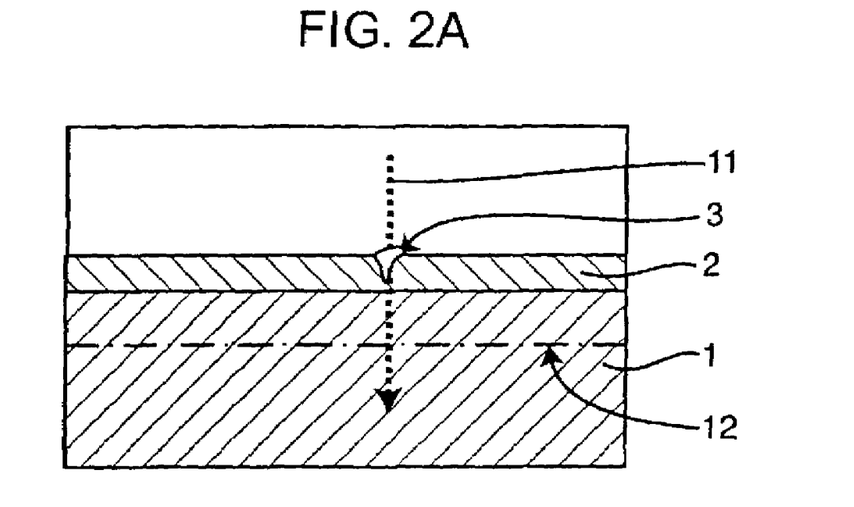
FIG. 2A is a fragmentary, cross-sectional view of a first embodiment of layers in a first phase of the method according to the invention.
Figure 2B:
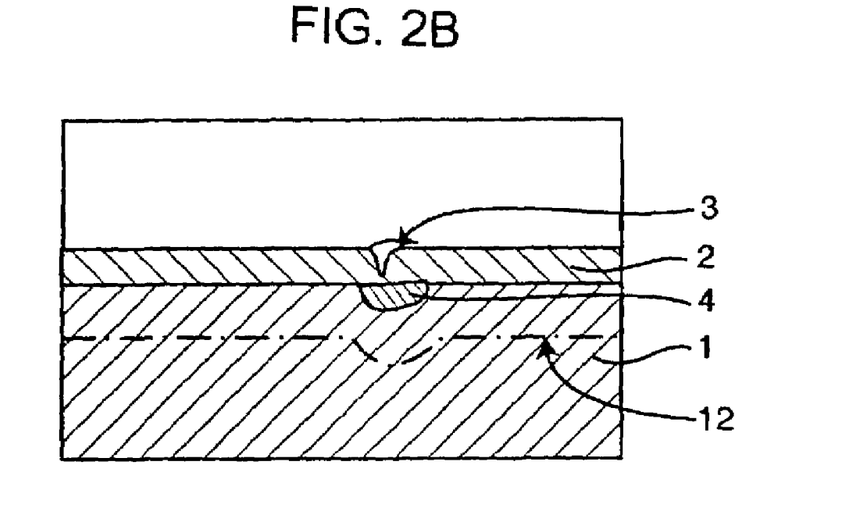
FIG. 2B is a fragmentary, cross-sectional view of the layers of FIG. 2A in a second phase.

FIGS. 2A and 2B illustrate two diagrammatic cross-sections through a dielectric layer 2 with a defect 3 respectively before the application and after the application of the method according to the invention.

In FIG. 2A, a dielectric layer 2 is disposed on a substrate 1. The dielectric layer 2 has a defect 3. The boundary of a space charge zone 12 that extends parallel to the substrate surface is illustrated in the substrate. In an electrochemical cell, an ion transport 11, then, takes place in the direction shown and leads to an oxidation in the substrate 1.

The result of such a process is illustrated in FIG. 2B. A reinforcement region 4 made of an electrically nonconductive substrate follow-up material has been formed in a region of the substrate 1 that adjoins the defect 3 of the dielectric layer 2. At the level of the reinforcement region 4, the space charge zone 12 in the substrate has an indentation in a direction facing away from the dielectric layer 2.

Figure 3A:
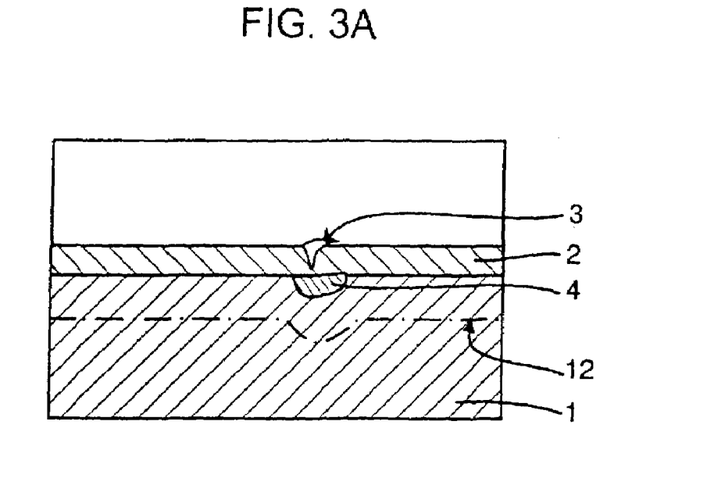
FIG. 3A is a fragmentary, enlarged, cross-sectional view of a portion of the trenches of FIG. 3B in a second embodiment of the method according to the invention.

FIG. 3A shows a diagrammatic cross-section through a detail from a configuration according to the invention, as already disclosed in FIG. 2B. In this case, FIG. 3A is a detail from FIG. 3B.

Figure 3B:
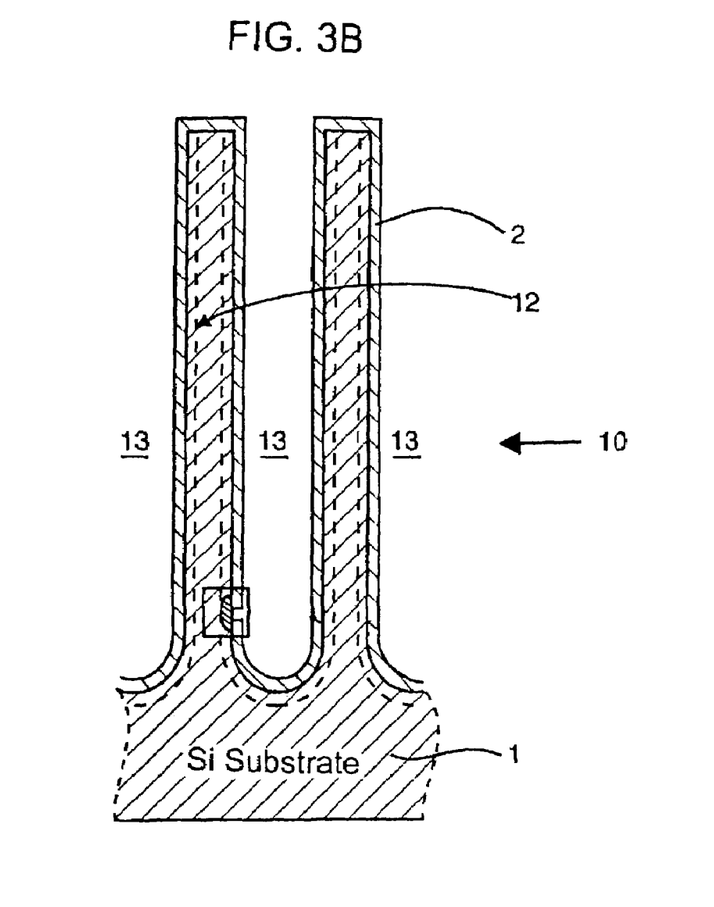
FIG. 3B is a fragmentary, cross-sectional view of a trench configuration according to the invention.

FIG. 3B illustrates a detail from a DT wafer 10 with a plurality of trenches 13 in the substrate 1. A dielectric layer 2 is deposited on the inside of the trenches 13. If the trenches are fashioned into capacitors, the substrate 1 forms a first electrode common to all the trench capacitors. The respective second electrode is formed by filling the trench 13 with a conductive material, for instance, doped silicon. The broken lines illustrate the boundary of a space charge zone 12 that forms, for instance, during operation of the finished trench capacitor. It becomes clear that even defects in trenches having a high aspect ratio can be reinforced by the method according to the invention.

We claim:

1. A method for producing a thin dielectric layer on a substrate, which comprises:
providing a substrate substantially of a conductive substrate material that can be oxidized to form a nonconductive substrate follow-up material;
applying the dielectric layer to the substrate at least in sections on the substrate by depositing the dielectric layer initially as an amorphous layer and then subjecting the dielectric layer to a crystallization process, the dielectric layer in contact with the substrate and having electrically conductive defects, the dielectric layer being formed of a dielectric material different from the nonconductive substrate follow-up material;
introducing the substrate having the dielectric layer into an electrolyte-filled electrochemical cell having first and second electrodes;
electrically connecting the first electrode to the substrate and electrically connecting the second electrode with the electrolyte;
producing an electrical potential between the first and second electrodes and then:
controlling a current flow between the electrolyte and the substrate in an electrochemical process, the current flow being established through the dielectric layer in regions of the defects; and
by an electrochemical reaction, chemically altering the substrate material exclusively in regions adjoining the defects and converting the chemically altered substrate material into the substrate follow-up material.

2. The method according to claim 1, which further comprises thermally treating the dielectric layer after application and thereby augmenting a plurality of weak points and defects in the dielectric layer with regard to charge carrier transmission.

3. The method according to claim 1, which further comprises thermally treating the dielectric layer after application and thereby augmenting a plurality of weak points and defects in the dielectric layer with regard to charge carrier transmission of the weak points and the defects.

4. The method according to claim 1, which further comprises providing the substrate material as amorphous or at least partially crystalline, doped and/or undoped silicon.

5. The method according to claim 1, which further comprises providing the substrate material as amorphous or at least partially crystalline silicon, the silicon being at least one of doped and undoped.

6. The method according to claim 1, which further comprises providing the dielectric layer with at least one dielectric partial layer, the at least one partial layer being formed at least from one dielectric material selected from a group consisting of $SiO_2$, $Si_3N_4$, $Al_2O_3$, $Ta_2O_5$, $Nb_2O_3$, $Y_2O_3$, $TiO_2$, $(Ta_2O_5)_9(TiO_2)_1$, $ZrO_2$, $HfO_2$, $(Hf,Zr)O_2$, $BaTiO_3$, and $(Sa, Sr) TiO_3$.

7. The method according to claim 1, which further comprises providing the dielectric layer with dielectric partial layers, each partial layer being formed at least from one dielectric material selected from a group consisting off $SiO_2$, $Si_3N_4$, $Al_2O_3$, $Ta_2O_5$, $Nb_2O_3$, $Y_2O_3$, $TiO_2$, $(Ta_2O_5)_9(TiO_2)_1$, $ZrO_2$, $HfO_2$, $(Hf,Zr)O_2$, $BaTiO_3$, and $(Ba,Sr)TiO_3$.

8. The method according to claim 1, which further comprises providing the electrolyte as aqueous $H_2SO_4$ or HCl.

9. The method according to claim 1, which further comprises galvanostatically controlling the electrochemical process in the electrochemical cell.

10. The method according to claim 1, which further comprises potentiostatically controlling the electrochemical process in the electrochemical cell.

11. The method according to claim 1, which further comprises providing the dielectric layer between two electrodes of a capacitor.

12. The method according to claim 1, which further comprises:
providing the first and second electrodes as first and second electrodes of a capacitor; and
providing the dielectric layer between the first and second electrodes of the capacitor.

13. The method according to claim 1, which further comprises providing the dielectric layer at least in sections on an inside of trenches in the substrate.

14. The method according to claim 1, which further comprises providing the dielectric layer at least in sections on an inside of at least one trench in the capacitor.

15. A substrate configuration, comprising:
a substrate substantially of a conductive substrate material that can be oxidized to form a nonconductive substrate follow-up material;
a dielectric layer of a dielectric material different from said nonconductive substrate follow-up material, said dielectric layer being deposited initially as an amorphous layer and then subjected to a crystallization process at least in sections on said substrate, said dielectric layer in contact with said substrate and having electrically conductive defects; and
said substrate having reinforcement regions of said substrate follow-up material, converted by an electrochemical reaction, exclusively in said sections of said substrate adjoining said detects of said dielectric layer.

16. The configuration according to claim 15, wherein said substrate material is amorphous or at least partially crystalline, doped or undoped silicon.

17. The configuration according to claim 15, wherein said substrate material as amorphous or at least partially crystalline silicon, said silicon being at least one of doped and undoped.

18. The configuration according to claim 15, wherein said dielectric layer has at least one dielectric partial layer formed from at least one dielectric material selected from a group of compounds consisting of $Si_3N_4$, $SiO_2$, $Al_2O_3$, $Ta_2O_5$, $Nb_2O_3$, $Y_2O_3$, $TiO_2$, $(Ta_2O_5)_9(TiO_2)_1$, $ZrO_2$, $HfO_2$, $(Hf,Zr)O_2$, $BaTiO_3$, and $(Ba,Sr)TiO_3$.

19. The configuration according to claim 15, wherein said dielectric layer has dielectric partial layers and each of said partial layers is formed from at least one dielectric material selected from a group of compounds consisting of $Si_3N_4$, $SiO_2$, $Al_2O_3$, $Ta_2O_5$, $Nb_2O_3$, $Y_2O_3$, $TiO_2$, $(Ta_2O_5)_9(TiO_2)_1$, $ZrO_2$, $HfO_2$, $(Hf,Zr)O_2$, $BaTiO_3$, and $(Ba,Sr)TiO_3$.

20. The configuration according to claim 15, wherein said reinforcement regions have a fashioning resulting from a galvanostatically controlled electrochemical process.

21. The configuration according to claim 15, wherein said reinforcement regions have a galvanostatically controlled, electrochemically produced fashioning.

22. The configuration according to claim 15, wherein said reinforcement regions have a fashioning resulting from a potentiostatically controlled electrochemical process.

23. The configuration according to claim 15, wherein said reinforcement regions have a potentiostatically controlled, electrochemical produced fashioning.

24. The configuration according to claim 15, wherein:
said substrate has at least one capacitor with two electrodes; and
said dielectric layer is disposed between said two electrodes of said capacitor.

25. The configuration according to claim 15, wherein:
said substrate has at least one MISFET having a gate electrode and a channel path; and
said dielectric layer is disposed between said gate electrode and said channel path.

* * * * *